United States Patent [19]

Flannagan

[11] Patent Number: 4,763,303

[45] Date of Patent: Aug. 9, 1988

[54] WRITE-DRIVE DATA CONTROLLER

[75] Inventor: Stephen T. Flannagan, Austin, Tex.

[73] Assignee: Motorola, Inc., Schaumburg, Ill.

[21] Appl. No.: 832,607

[22] Filed: Feb. 24, 1986

[51] Int. Cl.[4] .......................... G11C 7/00; G11C 11/34
[52] U.S. Cl. ................................... 365/189; 365/190;
365/233; 307/451; 307/475
[58] Field of Search ............... 365/189, 190, 187, 230,
365/233; 307/241, 475, 571, 579, 451, 291, 595

[56] References Cited

U.S. PATENT DOCUMENTS

| 4,129,792 | 12/1978 | Kawagai et al. | 307/595 X |
| 4,151,609 | 4/1979 | Moss | 365/233 X |
| 4,513,372 | 4/1985 | Ziegler et al. | 365/230 |
| 4,608,669 | 8/1986 | Klara | 365/233 x |
| 4,612,466 | 9/1986 | Stewart | 307/451 X |
| 4,623,990 | 11/1986 | Allen et al. | 365/230 X |
| 4,633,440 | 12/1986 | Pakulski | 365/230 |
| 4,635,234 | 1/1987 | Yamaguchi | 365/233 |
| 4,682,048 | 7/1987 | Ishimoto | 365/233 X |
| 4,707,809 | 11/1987 | Ando | 365/189 |

Primary Examiner—Stuart N. Hecker
Assistant Examiner—Alyssa H. Bowler
Attorney, Agent, or Firm—John A. Fisher; Jeffrey Van Myers; James L. Clingan, Jr.

[57] ABSTRACT

A write drive data control circuit for controlling the transmission of data to a memory array includes data input means for receiving complimentary data signals which are then transmitted to output circuits. The valid data is latched and the input circuits disabled. The output circuits remain enabled so as to pass the latched data to the memory array. After a predetermined period of time, the output circuits are disabled. In this manner, both the data set up time and data hold time may be independently optimized.

9 Claims, 3 Drawing Sheets

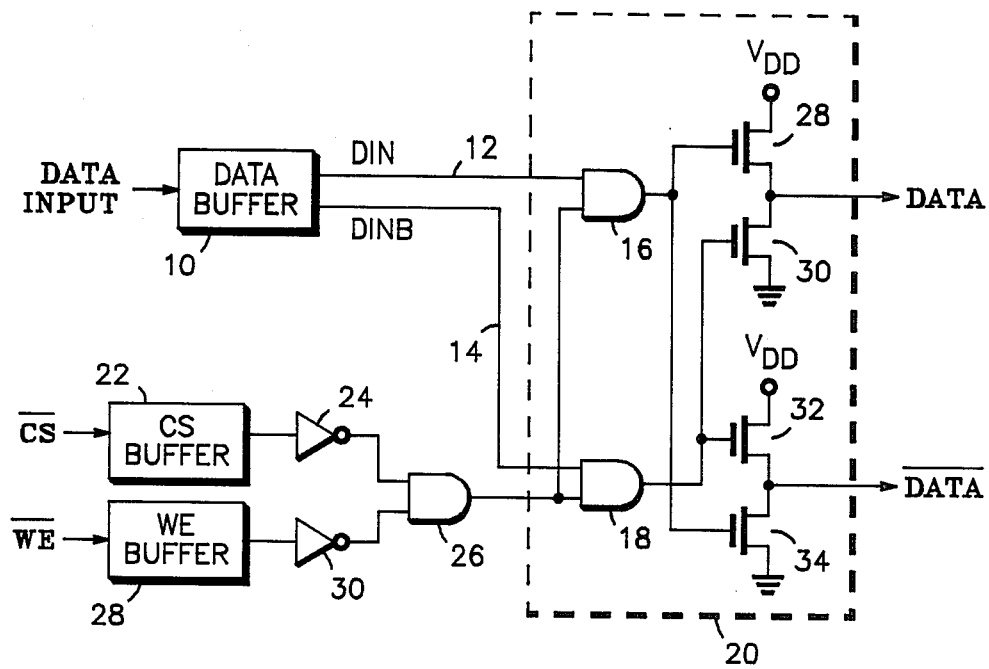
FIG. 1A
—PRIOR ART—
FIG. 1B
—PRIOR ART—
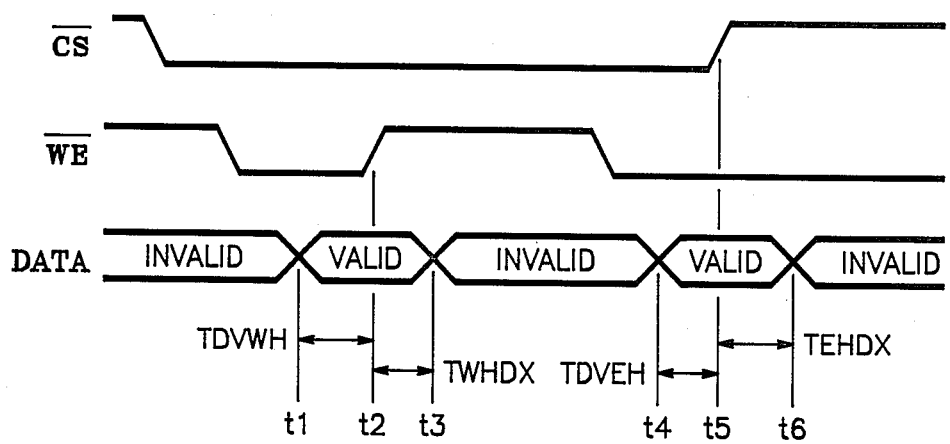

WRITE-DRIVE DATA CONTROLLER

Background of the Invention

This invention relates generally to static random access memory (SRAM) circuits, and more particularly to a write-drive data controller wherein the data set-up to end of write time (TDVWH) and the data hold from end of write time (TWHDX) may be optimized.

In the case of the write function in static random access memories, it is difficult to optimize both TDVWH and TWHDX due to their conflicting requirements. Currently in fast SRAMs, TWHDX is typically specified to be five nanoseconds, and TDVWH is typically specified to be approximately twenty-five nanoseconds. To achieve a low TDVWH, it is necessary that the propogation time of data from the data input pin to the memory cell via the write driver be short. Conversely, however, to achieve a low TWHDX, it is necessary that the propogation delay in the data path be long; i.e. the propagation of data into the write driver must take longer than the propagation of the write control signal. This is so since the function of the write control signal, at this point, is to prevent invalid data from reaching the data lines, thus preventing invalid data from being written into the memory cells.

The approach typically used is to have a write-enable signal enter the write driver at the end of a write pulse and cause the driver to be turned off thus preventing data changes occurring after the end of the write operation from propagating into the memory array. The data path upstream of the driver is hence designed to be longer than the write control path along which the write enable signal propagates. In this manner, TWHDX may be specified to have a minimum near zero nanoseconds. Unfortunately, TDVWH tends to increase due to this inherent data path delay.

SUMMARY OF THE INVENTION

It is an object of the present invention to provide an improved write-drive data control circuit.

It is a further object of the present invention to provide a write-drive data control circuit wherein TDVWH and TWHDX may be independently optimized.

It is a still further object of the present invention to provide a write-drive data controller wherein the input data is latched prior to disabling the write driver outputs.

According to a broad aspect of the invention there is provided a write drive data control circuit for controlling the transmission of data to a memory array, comprising data input means for receiving at an input thereof a serial data stream of alternating valid and invalid data, and having at least one output. Control means are coupled to the data input means for receiving a first control signal capable of assuming at least first and second stable states, the control means for enabling the passage of valid data from the input to the at least one output when said first control signal is in said first state, and for disabling the data input means when the first control signal is in said second state. Latching means are coupled to the at least one output for latching the data appearing thereon when said first control signal changes from said first state to said second state. Data output means are coupled to the latching means and to the at least one output for providing a data signal to the memory array from (i) the at least one output when the first control signal is in its first state, and (ii) from said latching means for a predetermined period of time after said data input means has been disabled.

According to a further aspect of the invention there is provided a method for controlling the writing of valid data into a memory array. A serial data stream of alternately valid and invalid data is received at a data input circuit having at least one input and at least one output. A first control signal capable of assuming at least first and second stable states is also received. The passage of valid data to the at least one output is enabled when the first control signal is in its first state, and the data input circuit is disabled when the first control signal is in its second state. Valid data is latched in a latching circuit; and a data signal is provided from an output circuit to said memory array (i) from the at least one output when the first control signal is in its first state and (ii) from the latching means for a predetermined period of time after disabling the data input circuit.

The above and other objects, features and advantages of the present invention will be more clearly understood from the following detailed description taken in conjunction with the accompanying drawings, in which:

BRIEF DESCRIPTION OF THE DRAWINGS

FIG. 1A is a partial schematic diagram of a write-drive data controller in accordance with the prior art;

FIG. 1B is a timing diagram which assists in the explanation of the arrangement shown in FIG. 1A;

DESCRIPTION OF THE PREFERRED EMBODIMENT

Figure 2A:
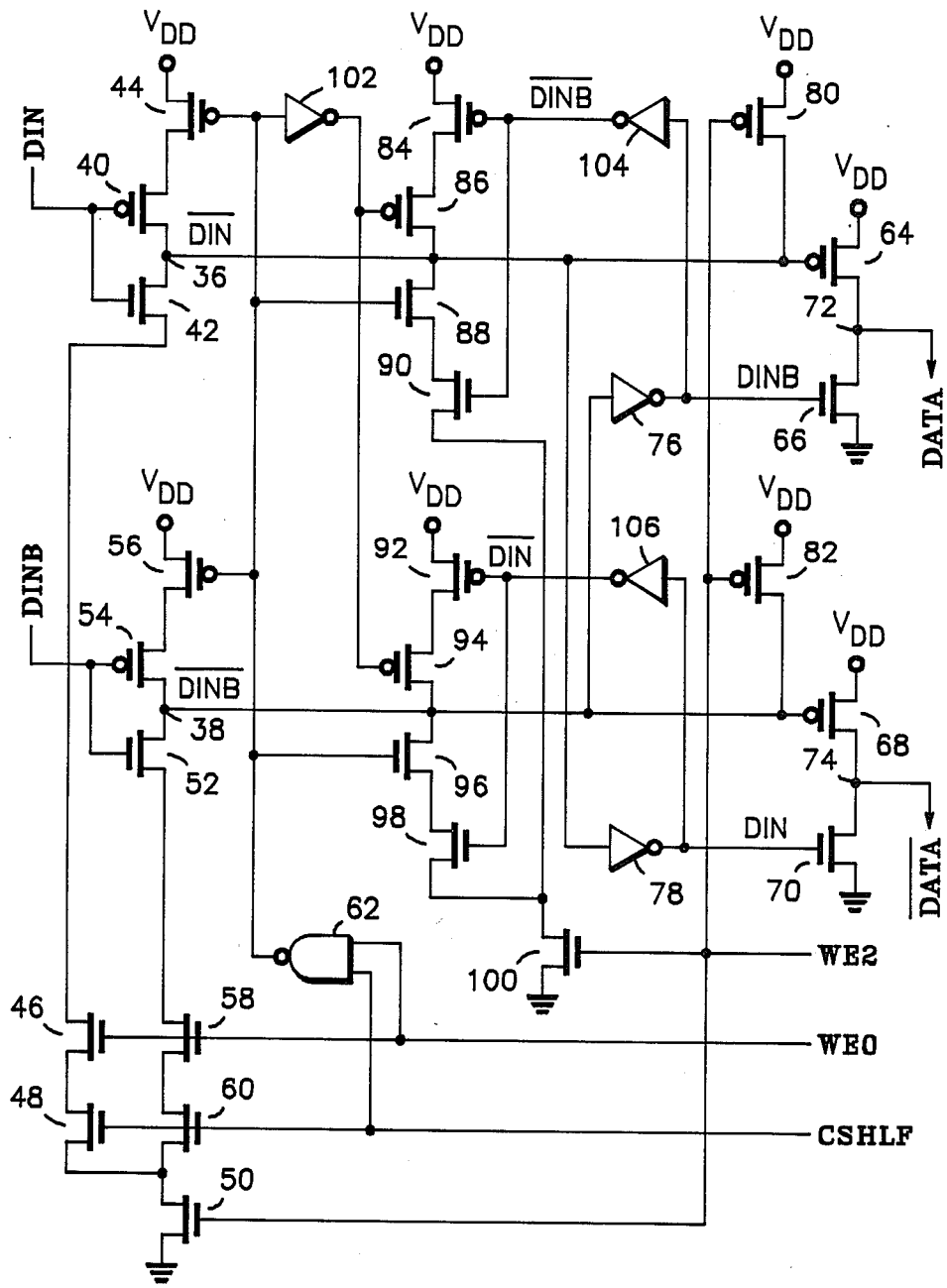
FIG. 2A is a schematic diagram of the inventive write drive data control circuit.

Before embarking on a discussion of the invention, it should be noted that the data hold from chip deselect time (TEHDX) is similar in function to TWHDX, and that the data set up to chip deselect time (TDVEH) is similar in function to TDVWH. That is, a write operation may be started and stopped by the chip-select input just as it is by the write-enable input. Therefore, the following discussions apply equally to chip-select timing as it does to the write-enable timing.

FIG. 1A illustrates a write drive data control circuit in accordance with the teachings of the prior art. As can be seen, the data input is applied to a data buffer 10 which produces a data signal (DIN) on output 12 and a complementary data signal (DINB) on output 14. DIN and DINB are applied to first inputs of first and second AND gates 16 and 18 respectively of write driver 20.

A chip select signal ($\overline{CS}$) is applied to an input of buffer 22 the output of which is inverted in inverter 24 and applied to a first input of AND gate 26. A write enable signal ($\overline{WE}$) is applied to an input of buffer 28 the output of which is inverted in inverter 30 and applied to a second input of AND gate 26. The output of AND gate 26 is applied to second inputs of AND gates 16 and 18.

Write driver 20 includes first, second, third and fourth N-channel field effect transistors 28, 30, 32 and 34 respectively. The source electrode of transistor 28 is coupled to a source of supply voltage ($V_{DD}$), while its drain electrode is coupled to the source electrode of transistor 30 and forms the data output (DATA) over which data propagates to the memory cell. Similarly, the source electrode of transistor 32 is coupled to $V_{DD}$ and has a drain electrode coupled to the source electrode of transistor 34 forming a complementary data output (DATA) over which a complementary data signal propagates to the memory array. The source electrodes of transistors 30 and 34 are coupled to ground. The gate electrodes of transistors 28 and 34 are coupled to the output of AND gate 16, and the gate electrodes of transistors 30 and 32 are coupled to the output of AND gate 18.

FIG. 1B illustrates the chip select signal ($\overline{CS}$), the write enable signal ($\overline{WE}$) and alternating periods of invalid and valid data as indicated. Referring to FIGS. 1A and 1B, whenever $\overline{CS}$ and $\overline{WE}$ are both low, the output of AND gate 26 is high thus permitting DIN and $\overline{DIN}$ to pass through AND gates 16 and 18 respectively. If the output of AND gate 16 is high and the output of AND gate 18 is low, transistors 28 and 34 will be turned on while transistors 30 and 32 will be turned off. Thus, a high will appear at the DATA output and a low will appear at the $\overline{DATA}$ output. If, on the other hand, the output of AND gate 16 is low and the output of AND 18 is high, transistors 28 and 34 will be turned off and transistors 30 and 32 will be turned on. In this case, a low will appear at the DATA output, and a high will appear at the $\overline{DATA}$ output.

At time t1, the data at the data input becomes valid. During this time, the output of AND gate 26 is high permitting the information to flow through the write driver. At time t2, the write enable signal WE goes high causing the output of AND gate 26 to go low and turning off AND gates 16 and 18. Thus, subsequent changes in data will not be permitted to pass through AND gates 16 and 18. Furthermore, since the outputs of AND gates 16 and 18 are low, transistors 28, 30, 32, and 34 are all off causing the DATA and $\overline{DATA}$ outputs to be tri-stated. At time t3, the data makes a transition from valid to invalid. The elapsed time from t1 to t2 represents the above referred to data set up time (TDVWH), and the time from t2 to t3 represents the above referred to data hold time (TWHDX).

As can be seen, a similar phenomenon takes place when the chip select signal (CS) goes high time t5. Therefore, the data set-up time to chip deselect (TDVEH) is represented by the elapsed time from t4 to t5 while the data hold from chip deselect (TEHDX) is the period of time from t5 to t6.

It would be desirable if TWHDX (and TEHDX) could be specified to be zero. For this to be true, a guard band must necessarily be provided and therefor the circuit must perform correctly even when TWHDX is negative. To accomplish this, the propagation delay of the data to the write driver must be greater than the propagation delay in the control path (i.e. the path including AND gate 26). Unfortunately, this is inconsistent with a reduction in TDVWH since this would require a reduction in the propagation delay of the data.

Furthermore, as is commonly known in the art, a non-zero propagation delay exists from the data output of driver 20 to the memory array, including time required to drive data (true and complement) through data lines, bit-lines, column decoders and other similar circuits common to memory arrays. Such delays are down stream from both the control path and data paths of FIG. 1A. Since addresses often control such internal memory-array paths, the address hold time (TWHAX) reduction will also be inconsistent with low TDVWH and low TWHDX, since the tristating of driver 20 stops not only the driving of invalid data, but also valid data as well.

Figure 2B:
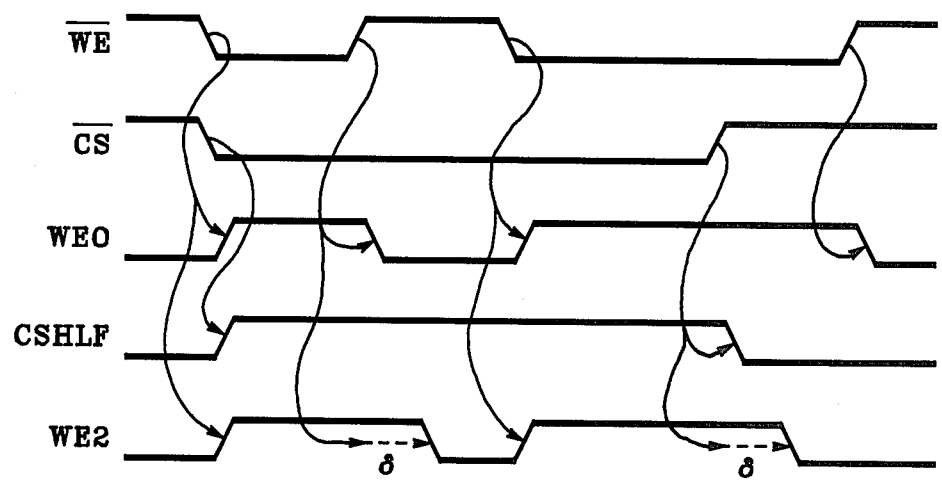
FIG. 2B is a timing diagram which assists in the explanation of the circuit shown in FIG. 2A.

Prior to discussing the inventive circuit shown in FIG. 2A, a brief description of the control signals used in the circuit of FIG. 2A and shown in FIG. 2B is deemed advisable. First, the write enable signal ($\overline{WE}$) and the chip select signal ($\overline{CS}$) shown in the first two lines of FIG. 2B have already been discussed in conjunction with FIG. 1B. Control signal WEO has a leading edge which triggers off the trailing edge of $\overline{WE}$ and a trailing edge which triggers off the leading edge of $\overline{WE}$. Therefore, WEO can be considered the complement of $\overline{WE}$ slightly delayed. In a similar fashion, control signal CSHLF has a leading edge which triggers off the trailing edge of $\overline{CS}$ and a trailing edge which triggers off the leading edge of $\overline{CS}$. Again, CSHLF may be considered to be the complement of $\overline{CS}$ slightly delayed. Control signal WE2 may be thought of as being high whenever both $\overline{WE}$ and $\overline{CS}$ are low with one exception. That is, as can be seen in FIG. 2B, trailing edge of WE2 is delayed by an amount $\alpha$.

Referring now to FIG. 2A, both true and complimentary data signals DIN and DINB are applied to first and second input circuits having first and second output nodes 36 and 38 respectively. Data signal DIN is applied to the gate electrodes of P-channel field effect transistor 40 and N-channel field effect transistor 42, each of which have drain electrodes coupled to node 36. The source electrode of transistor 40 is coupled to the drain electrode of P-channel field effect transistor 44 which in turn has a source electrode coupled to a first source of supply voltage ($V_{DD}$). The source electrode of transistor 42 is coupled to the drain electrode of N-channel field effect transistor 46 whose gate electrode is coupled to control signal WE0. The source electrode of transistor 46 is coupled to the drain electrode of N-channel field effect transistor 48 which has a gate coupled to control signal CSHLF. The source electrode of transistor 48 is coupled to the drain electrode of transistor 50 which has a gate electrode coupled to control signal WE2 and a source electrode coupled to ground.

The complementary data input signal DINB is coupled to gate electrodes of N-channel field effect transistor 52 and P-channel field effect transistor 54 each of which have drain electrodes coupled to node 38. The source electrode of transistor 54 is coupled to the drain electrode of P-channel field effect transistor 56 which in turn has a source electrode coupled to $V_{DD}$. The source electrode of transistor 52 is coupled to the drain electrode of N-channel field effect transistor 58 which has a gate electrode coupled to control signal WE0. The source electrode of transistor 58 is coupled to the drain electrode of N-channel field effect transistor 60 whose gate electrode is coupled to control signal CSHLF. The source electrode of transistor 60 is coupled to the drain electrode of transistor 50. Control signals WE0 and CSHLF are applied to first and second inputs of NAND gate 62 having an output which is applied to the gate electrodes of transistors 44 and 56.

The circuit shown in FIG. 2A includes first and second output circuits. The first output circuit includes P-channel field effect transistor 64 and N-channel field effect transistor 66. The second output circuit includes P-channel field effect transistor 68 and N-channel field effect transistor 70. These first and second output circuits produce complementary data signals (DATA and DATA) at nodes 72 and 74 respectively for transmission to the memory array. The drain electrodes of transistors 64 and 66 are coupled to node 72, and the drain electrodes of transistors 68 and 70 are coupled to node 74. Transistors 64 and 68 have source electrodes coupled to $V_{DD}$, and transistor 66 and 70 have source electrodes coupled to ground. The gate electrode of transistor 64 is coupled to node 36, and the gate of transistor 66 is coupled to node 38 through inverter 76. The gate electrode of transistor 68 is coupled to node 38, and the gate electrode of transistor 70 is coupled to node 36 through inverter 78.

A first P-channel field effect transistor coupled between $V_{DD}$ and node 36 has a gate electrode coupled to control signal WE0. A second P-channel field effect transistor coupled between $V_{DD}$ and node 38 similarly has a gate electrode coupled to control signal WE2.

The arrangement shown in FIG. 2A also includes first and second latching mechanisms. The first latching mechanism includes P-channel field effect transistors 84 and 86 and N-channel field effect transistors 88 and 90. The second latching mechanism includes P-channel field effect transistors 92 and 94 and N-channel field effect transistors 96 and 98. The drain electrodes of transistors 86 and 88 are coupled to node 36, and the drain electrodes of transistors 94 and 96 are coupled to node 38. The source electrode of transistor 86 is coupled to the drain electrode of transistor 84 which in turn has a source electrode coupled to $V_{DD}$. The source electrode of transistor 88 is coupled to the drain electrode of transistor 90 which has a source electrode coupled to the drain electrode of N-channel field effect transistor 100. The source electrode of transistor 94 is coupled to the drain electrode of transistor 92 which in turn has a source electrode coupled to $V_{DD}$. The source electrode of transistor 96 is coupled to the drain electrode of transistor 98 which has a source electrode coupled to the drain electrode of transistor 100. The gate electrodes of transistors 88 and 96 are coupled to the output of NAND gate 62. The output of NAND gate 62 is also applied to the input of inverter 102 which has an output coupled to the gate electrodes of transistors 86 and 94. The output of inverter 76 is coupled to the input of inverter 104 which in turn has an output coupled to the gate electrodes of transistors 84 and 90. The output of inverter 78 is applied to the input of inverter 106 which has an output coupled to the gate electrodes of transistors 92 and 98. Finally, transistor 100 has a source electrode coupled to ground and a gate electrode coupled to control signal WE2.

The circuit in FIG. 2A operates as follows. As long as control signals WE2, WE0 and CSHLF are high, transistors 46, 48, 50, 58 and 60 will be turned on. Furthermore, the output of NAND gate 62 will be low causing transistors 44 and 56 to be turned on. In this mode, data signal DIN will be inverted by the inverter comprised of transistors 40 and 42 such that $\overline{\text{DIN}}$ will appear at node 36. Similarly, complementary data signal DINB will be inverted through the action of transistors 52 and 54 to produce $\overline{\text{DINB}}$ at node 38. The signal appearing at node 36 ($\overline{\text{DIN}}$) is applied to the gate electrode of transistor 64 and, via inverter 78 to the gate electrode of transistor 70. Similarly, the data signal appearing at node 38 ($\overline{\text{DINB}}$) is applied to the gate electrode of transistor 68 and via inverter 76 to the gate of transistor 66. Thus, $\overline{\text{DIN}}$ appears at the gate of transistor 64 and DINB appears at the gate of transistor 66. These signals are logically the same, and transistors 64 and 66 act as an inverter to produce a data (DATA) signal at output node 72 which is similar in polarity to DIN. $\overline{\text{DINB}}$ appearing at the gate of transistor 68 and DIN appearing at the gate of transistor 70 are likewise logically the same and are complementary to the signal appearing at the gates of transistors 64 and 66. Therefore, a data signal ($\overline{\text{DATA}}$) will appear at node 74 which is complementary to the signal (DATA) appearing at node 72.

When either WE0 or CSHLF goes low, the input circuits become disabled. That is, for example, if WE0 goes low, transistors 44, 46, 56 and 58 will turn off. Similarly, if CSHLF goes low, transistors 44, 48, 56, and 60 will turn off. Simultaneously therewith, however, transistors 88 and 96 will turn on and, since the output of inverter 102 is low when either WE0 or CSHLF is low, transistors 86 and 94 will likewise turn on. It must be remembered that at this time, the output of inverter 104 ($\overline{\text{DINB}}$) is applied to the gate electrodes of transistors 84 and 90. Therefore, with transistors 86 and 88 on, transistors 84 and 90 act as an inverter to produce DINB at node 36 (logically equivalent to $\overline{\text{DIN}}$ which previously appeared at node 36). Therefore, the proper signal has been latched at node 36. Similarly, transistors 92 and 98 will act as an inverter to produce DIN at node 38 which is logically the same as $\overline{\text{DINB}}$. Again, the proper data signal has been latched at node 38.

Having accomplished the latching function, the data input signals DIN and DINB may become invalid without affecting the data appearing at nodes 36 and 38 which may continue to be applied to the output circuits. Since the data has been latched and the input circuits disabled, invalid data is successfully blocked while still permitting the output circuits to be driven by the latched data. Therefore, it is no longer necessary to have as large a data set-up time (TDVWH) as was previously required. Furthermore, since the data has been latched, the data hold time (TWHDX) may likewise be reduced.

When WE2 finally goes low, transistors 50 and 100 turn off and transistors 80 and 82 turn on. This causes a high voltage to appear at the gate electrodes of transistors 64 and 68 and, due to the action of inverters 76 and 78, a low voltage to appear at the gate electrodes of transistors 66 and 70. Transistors 64, 66, 68 and 70 are turned off thus tri-stating output nodes 72 and 74.

The circuit described in connection with FIG. 2A permits the data setup time and data hold time to be independently optimized and does so in a way which requires only two inversions from data input to data output.

The above description is given by way of example only. Changes in form and details may be made by one skilled in the art without departing from the scope of the invention as defined by the appended claims.

I claim:

1. A write drive data control circuit for controlling the transmission of data to a memory array, comprising:
    data input means for receiving at at least one input thereof a serial data stream of alternating valid and invalid data, and having at least one output;
    control means coupled to said data input means for receiving a first control signal capable of assuming at least first and second stable states, said control means for enabling the passage of valid data from said at least one input to said at least one output when said first control signal is in said first state, and for disabling said data input means when said first control signal is in said second state;

latching means coupled to said at least one output for latching the data appearing thereon when said first control signal changes from said first state to said second state; and data output means coupled to said latching means and to said at least one output for providing a data signal to said memory array from (i) said at least one output when said first control signal is in said first state, and (ii) from said latching means for a predetermined period of time after said data input means has been disabled.

2. A circuit according to claim 1 further comprising disabling means for disabling said data output means after said predetermined period of time.

3. A circuit according to claim 2 wherein said data input means comprises:
a first input circuit having a first input for receiving data thereon and having a first output; and
a second input circuit having a second input for receiving complementary data thereon, and having a second output.

4. A circuit according to claim 3 wherein said control means comprises switching means coupled in series with each of said first and second data input circuits, the series combination being coupled between first and second sources of supply voltage.

5. A circuit according to claim 4 wherein said latching means comprises:
a first latch circuit coupled to said first output; and
a second latch coupled to said second output.

6. A circuit according to claim 5 wherein said data output means comprises:
a first output circuit coupled to said first output and to said first latch circuit for providing a data output to said memory array; and a second output circuit coupled to said second output and to said second latch circuit for providing a complementary data output to said memory array.

7. A circuit according to claim 6 further comprising:
at least a first switch coupled in series with said first latch between said first and second sources of supply voltage and controlled by said first control signal; and
at least a second switch coupled in series with said second latch between said first and second sources of supply voltage and controlled by said first control signal.

8. A method for controlling the writing of valid data into a memory array, comprising:
receiving a serial data stream of alternately valid and invalid data at a data input circuit having at least one input and at least one output;
receiving a first control signal capable of assuming at least first and second stable states;
enabling the passage of valid data to said at least one output when said first control signal is in said first state;
disabling said data input circuit when said first control signal is in said second state;
latching said valid data in a latching circuit; and
providing from an output circuit a data signal to said memory array (i) from said at least one output when said first control signal is in said first state and (ii) from said latching means for a predetermined period of time after disabling said data input circuit.

9. A method according to claim 8 further comprising disabling said output circuit after said predetermined period of time.

* * * * *

UNITED STATES PATENT AND TRADEMARK OFFICE
CERTIFICATE OF CORRECTION

PATENT NO. : 4,763,303

DATED : August 9, 1988

INVENTOR(S) : Stephen T. Flannagan

It is certified that error appears in the above-identified patent and that said Letters Patent is hereby corrected as shown below:

In the claims:

Column 6, line 58, change "at at" to --at--.

Signed and Sealed this

Seventh Day of March, 1989

Attest:

DONALD J. QUIGG

Attesting Officer

Commissioner of Patents and Trademarks